United States Patent [19]

King

[11] 4,079,507

[45] Mar. 21, 1978

[54] METHOD OF MAKING SILICON-INSULATOR-POLYSILICON INFRARED IMAGING DEVICE WITH ORIENTIALLY ETCHED DETECTORS

[75] Inventor: Gerard J. King, Alexandria, Va.

[73] Assignee: The United States of America as represented by the Secretary of the Army, Washington, D.C.

[21] Appl. No.: 767,244

[22] Filed: Feb. 10, 1977

Related U.S. Application Data

[62] Division of Ser. No. 705,500, Jul. 15, 1976, Pat. No. 4,063,268.

[51] Int. Cl.$^2$ .................... H01L 21/20; H01L 27/14
[52] U.S. Cl. .................................. 29/578; 29/580; 29/589; 148/1.5; 148/175; 156/647; 156/653; 156/657; 156/661; 250/332; 250/370; 357/24; 357/30; 357/60
[58] Field of Search .................. 148/1.5, 175; 29/578, 29/580, 589; 357/24, 30, 60; 250/332, 370; 156/647, 653, 657, 661

[56] References Cited

U.S. PATENT DOCUMENTS

| | | | |
|---|---|---|---|
| 3,423,651 | 1/1969 | Legat et al. | 29/580 X |
| 3,486,892 | 12/1969 | Rosvold | 29/578 X |
| 3,806,729 | 4/1974 | Caywood | 250/370 X |
| 3,863,070 | 1/1975 | Wheeler et al. | 250/370 X |
| 3,883,437 | 5/1975 | Nummedal et al. | 357/24 X |
| 3,884,733 | 5/1975 | Bean | 148/175 |
| 3,900,863 | 8/1975 | Kim | 148/175 X |
| 3,902,133 | 8/1975 | Watts | 148/175 X |
| 4,028,719 | 6/1977 | Curtis | 357/24 X |

OTHER PUBLICATIONS

Steckl et al., "Theoretical Analysis–IRCCD Serial Scanning(U)", Proc. Appl. Conf. of CCD, San Diego, CA., 1973, pp. 247-258.

Monahan et al., "Use of Charge Coupled Devices--Processing", Proc. Appl. Conf. on Charge Coupled Dev., San Diego, CA., 1975, pp. 217-227.

Bean et al., "Influence of Crystal Orientation-Processing", Proc. of IEEE, vol. 57, No. 9, Sept. 1969, pp. 1469-1476.

Lee; D. B., "Anisotropic Etching of Silicon", J. Appl. Phys., vol. 40, No. 11, Oct. 1969, pp. 4569-4574.

Primary Examiner—L. Dewayne Rutledge
Assistant Examiner—W. G. Saba
Attorney, Agent, or Firm—Nathan Edelberg; Aubrey J. Dunn; Robert P. Gibson

[57] ABSTRACT

A layer of epitaxial silicon is grown on an epi-silicon growth substrate, a thin silicon dioxide layer is grown on the epitaxial layer, and thick layer of polysilicon is grown on the dioxide layer. The epi-silicon layer is then removed, and the epitaxial layer is masked and doped to produce both a region capable of CCD action and an infrared sensitive region. The doped epitaxial layer is orientially etched through a mask to produce isolated infrared sensitive areas to serve as detectors and an isolated area capable of CCD action. Coupling regions are also doped on the CCD ares. The detectors and the CCD area are each in the shape of a frustum of a right rectangular pyramid, with its base on the silicon dioxide layer. Electrical pads are grown to form CCDs. Electrical leads are grown, some to connect respective CCDs to respective coupling regions, some to serve as drive lines for the CCDs, some as common lines for the detectors, and some as connecting lines between respective detectors and coupling regions. A perforated opaque mask is placed on the opposite side of the polysilicon from the silicon dioxide layer, with the perforations aligned with respective ends of the detectors.

2 Claims, 3 Drawing Figures

METHOD OF MAKING SILICON-INSULATOR-POLYSILICON INFRARED IMAGING DEVICE WITH ORIENTIALLY ETCHED DETECTORS

The invention described herein may be manufactured, used, and licensed by and for the United States Government for governmental purposes without the payment of any royalty thereon.

CROSS REFERENCE TO RELATED APPLICATIONS

This invention is a division of my application Ser. No. 705,700, filed July 15, 1976, granted U.S. Pat. No. 4,063,268 of Dec. 13, 1977, and is an improvement over the invention as described in copending application Ser. No. 705,641, filed July 15, 1976 in which I was a joint inventor. Su

BACKGROUND OF THE INVENTION

This invention is in the field of solid-state imaging detectors for infrared. Various types of such detectors have been proposed, but have been difficult to make with good definition, low noise figures, and high quantum efficiencies. The instant invention takes advantage of the known (and desirable) siliconinsulator-polysilicon (SIP) on-chip growth technology. Extrinsic detectors using such a technology may be produced, but such detectors have low optical density in the infrared and require thicknesses incompatable with SIP. The instant invention is able to use SIP, and by using orientionally dependent etching (ODE), the thickness requirement for detectors is transformed into a lateral dimension. Exemplary references for the above-mentioned technology are the book *Basic Integrated Circuit Engineering* by Hamilton and Howard, published in 1975 by McGraw-Hill Book Co. and bearing Library of Congress Catalog Card No. 74-23921, and the periodical *Proceedings of the IEEE* of January 1975. Pages 83–88 of the book and pages 63–66 of the periodical are particularly pertinent. Moreover, a "classical" paper on oriential etching is the paper by Bean and Gleim on pages 1469–1476 of *Preceedings of the IEEE,* Vol. 57, No. 9, of September 1969. A more recent article on ODE is on pages 545–552 of the April 1975 edition of the *Journal of the Electrochemical Society.*

SUMMARY OF THE INVENTION

The invention is a method of making an infrared imaging device. The device is made by SIP growth technology to form a two-dimensional array of incremental extrinsic detectors. ODE is used to make the detectors each have the shape of a frustum of a right rectangular pyramid, with the base of a pyramid on the chip. During processing of the chip for the detectors, charge coupled devices (CCD's) are also made on the chip. These CCD's are indirectly connected to respective detectors and to readout (drive) lines on the chip.

DETAILED DESCRIPTION OF THE INVENTION

Figure 1:
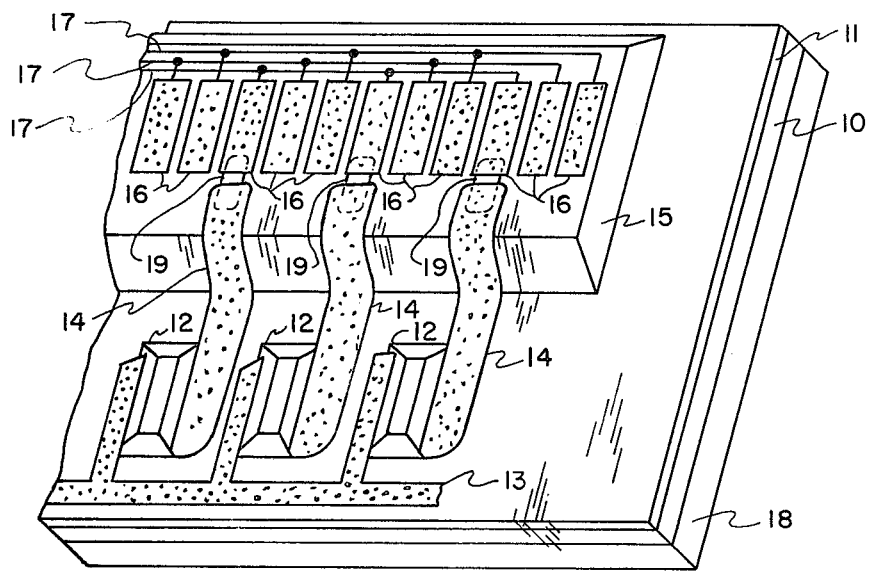
FIG. 1 is a partial schematic diagram of the inventive device.

The invention may perhaps be best understood by referring to the drawings of the inventive device, in which FIG. 1 shows layer 10 of polysilicon which acts as a mechanical support of the remainder of the device. Layer 11 is a thin silicon dioxide layer on layer 10. On layer 11 are detectors 12 having electrical connecting leads 13 and 14. As can be seen, lead 13 is common to one side of each of detectors 12. Reference numeral 15 designates a mesa of silicon doped for CCD's 16 having drive conductors 17. Additionally, doped coupling regions 19 are on mesa 15. Each of detectors 12 is connected to a respective one of coupling regions 19 by respective leads 14 for readout of the detectors. Layer 10 is covered on the opposite side from layer 11 by perforated mask 18.

Figure 2:
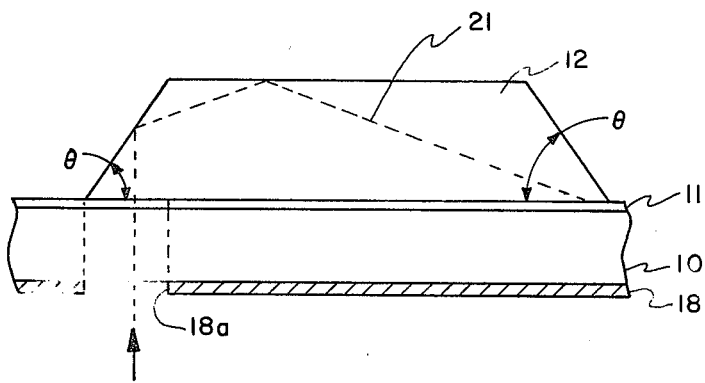
FIG. 2 is a sectional view of one detector of the device.

The shape of detectors 12 and placement of the perforations in mask 18 may be seen in FIG. 2. Each detector 12 is extrinsic silicon with an isocoles trapezoid cross-section, and with perforation 18a of mask 18 at one end of 12. Infrared radiation from direction 20 thus passes through perforation 18a and enters detector 12. Angle $\theta$ of 12 is such that the radiation along dotted ray 21 is reflected to follow the path as shown. Radiation incident on 12 from direction 20 therefore has a long optical path in 12 compared to the thickness above layer 11 of detector 12. Such a long optical path allows greater absorption of photons than would be the case with only the thickness of 12.

Figure 3:
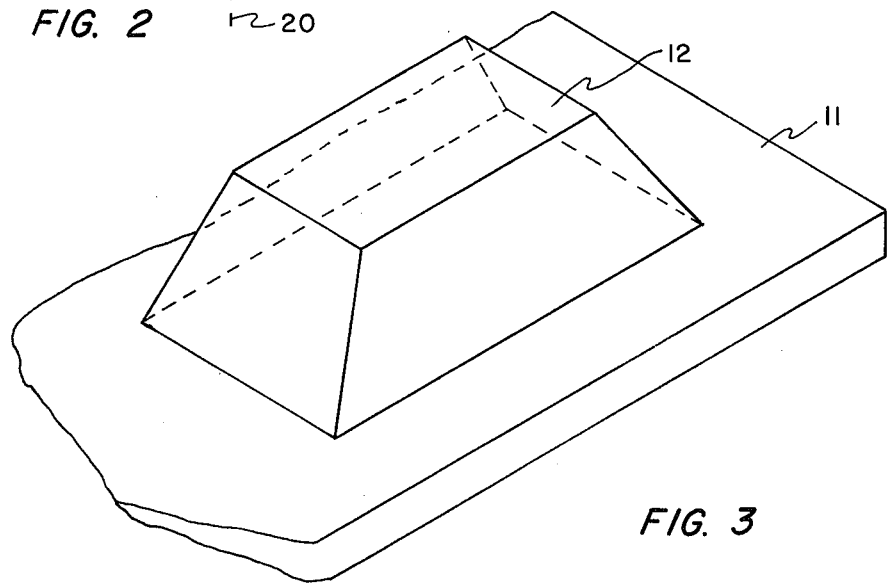
FIG. 3 is a pictorial view of one detector of the device.

FIG. 3 shows that detector 12 is a frustum of a right rectangular pyramid with its base on layer 11, with leads 13 and 14 connected along its longer trapezoidal faces (FIG. 1). As far as the crystalline structure of each detector is concerned, the top is the {100} plane, and each of the trapezoidal faces is a {111} plane. Angle $\theta$ for a typical etchant is 54.74°. A detector may have a base 0.003 inch by 0.01 inch as a typical size, with a 0.0016 inch height or thickness. Obviously, the drawings are not to scale, but have exaggerated dimensions for illustrations purposes. Apertures 18a may be 0.002 by 0.003 inch.

DESCRIPTION OF METHOD

The method whereby the above-described device may be produced is substantially known, but with variations to produce the instant device. The method begins with a growth substrate of epi-silicon (not shown on drawings). A layer of epitaxial silicon is grown on the substrate, a relatively thin layer 11 of silicon dioxide is grown on the epitaxial layer and a relatively thick layer 10 of polysilicon is grown on the dioxide layer. The growth substrate is then removed by etching, and the epitaxial layer is masked and doped for infrared sensitive extrinsic regions. The mask is stripped and a second mask is applied. The unmasked portion of the epitaxial is doped to produce a region capable of charge coupled device (CCD) action and to produce coupling regions. The second mask is removed and a third mask is applied. The epitaxial layer is then orientially etched through the third mask to produce a two-dimensional array of infrared detectors 12 from the previously doped infrared sensitive regions, and to produce an area capable of CCD action from the previously doped region capable of CCD action. The CCD area and each of the detectors is the shape of the shallow frustum of a right rectangular pyramid, with the longer sides of the detector pyramids being parallel. The detector array is thus an array of rows and columns of detectors 12 with equal spaces between the rows and columns. Since the detectors and the CCD area are on a silicon dioxide layer, they are electrically isolated from each other. The third mask is stripped from the epitaxial layer and a forth mask is applied through which a CCD pad array is deposited, and through which lead conductors 13 and 14 for the CCD pads 16 and detectors 12 are deposited. A common lead is deposited for one side of each detector, and individual leads are deposited from respective detectors to respective coupling regions 19. The fourth mask is stripped after the leads are deposited, and an infrared opaque mask is applied to the polysilicon substrate. This opaque mask has square perforations aligned with one end of each of the rectangular detectors.

While a specific method of making the invention has been described, variations are possible in this method within the scope of the invention. For example, the various steps of masking, doping and etching may be interchanged or combined in part, and the opaque mask may be applied at any time in the process.

I claim:

1. A method of making an infrared imaging device beginning with an episilicon growth substrate including the steps of:

(a) growing on said substrate an epitaxial layer,
   (b) growing on said epitaxial layer an infrared transparent insulating layer;
   (c) growing on said insulating layer a supporting infrared transparent layer;
   (d) removing said substrate from said layers;
   (e) masking said epitaxial layer in accordance with a first predetermined pattern;
   (f) doping the unmasked portions of said epitaxial layer to form infrared sensitive extrinsic regions;
   (g) stripping said masking said epitaxial layer with a second predetermined pattern;
   (h) doping the unmasked portions of said epitaxial layer to produce a region capable of CCD action and to produce coupling regions;
   (i) stripping said masking and masking said layer with a third predetermined pattern;
   (j) orientially etching said epitaxial layer to produce froms said infrared sensitive regions an array of isolated detectors, and to produce from said region capable of CCD action an area capable of CCD action and isolated from said array, each of said detectors and said area being a frustrum of a right rectangular pyramid;
   (k) stripping said masking and masking in accordance with fourth predetermined pattern;
   (l) depositing a conductor through said mask to form a CCD pad array, to form a separate lead from one side of each of said detectors to a corresponding coupling region to form a separate lead from respective CCD pads to respective coupling regions, to form a common lead for an opposite side of all of said detectors from said separate leads, and to form drive lines for said CCD's;
   (m) stripping said masking; and masking said supporting infrared transparent layer with an opaque layer having a fifth predetermined pattern, said fifth pattern having respective openings aligned with respective ends of said detectors.

2. The method as set forth in claim 1 wherein steps (b) and (h) are interchanged.

* * * * *